(12) United States Patent
Hong

(10) Patent No.: US 10,658,049 B2
(45) Date of Patent: May 19, 2020

(54) MEMORY CONTROLLER AND METHOD OF OPERATING THE SAME

(71) Applicant: SK hynix Inc., Gyeonggi-do (KR)

(72) Inventor: Ji Man Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/705,976

(22) Filed: Dec. 6, 2019

(65) Prior Publication Data

US 2020/0111531 A1 Apr. 9, 2020

Related U.S. Application Data

(62) Division of application No. 16/190,027, filed on Nov. 13, 2018, now Pat. No. 10,541,036.

(30) Foreign Application Priority Data

Mar. 23, 2018 (KR) ........................ 10-2018-0033961

(51) Int. Cl.
| | |
|---|---|
| *G11C 16/28* | (2006.01) |
| *G11C 16/08* | (2006.01) |
| *G11C 16/10* | (2006.01) |
| *G11C 16/24* | (2006.01) |
| *G11C 16/34* | (2006.01) |

(52) U.S. Cl.
CPC .............. *G11C 16/28* (2013.01); *G11C 16/08* (2013.01); *G11C 16/10* (2013.01); *G11C 16/24* (2013.01); *G11C 16/34* (2013.01)

(58) Field of Classification Search
CPC ......... G11C 16/06; G11C 16/28; G11C 16/08; G11C 16/10; G11C 16/24; G11C 16/34
USPC ....................................... 365/185.01–185.33
See application file for complete search history.

(56) References Cited

U.S. PATENT DOCUMENTS

| | | | | |
|---|---|---|---|---|
| 2010/0135082 A1* | 6/2010 | Bathul | .................... | G11C 16/04 365/185.19 |
| 2012/0140586 A1* | 6/2012 | Kim | ......................... | G11C 5/02 365/230.03 |
| 2013/0201770 A1* | 8/2013 | Harris | .................... | G11C 5/025 365/189.011 |

* cited by examiner

*Primary Examiner* — Harry W Byrne
(74) *Attorney, Agent, or Firm* — IP & T Group LLP

(57) ABSTRACT

Provided herein may be a memory controller and a method of operating the same. The memory controller may include a control component configured to control an operation of a semiconductor memory device including a plurality of memory cells in response to a request from a host. The control component may be configured to select a subset of memory cells, among all memory cells in a selected page of the semiconductor memory device, and to determine an optimal read voltage based on the select subset of memory cells.

8 Claims, 14 Drawing Sheets

MEMORY CONTROLLER AND METHOD OF OPERATING THE SAME

CROSS-REFERENCE TO RELATED APPLICATION

This application is a division of U.S. patent application Ser. No. 16/190,027 filed on Nov. 13, 2018, which claims benefits of priority of Korean Patent Application No. 10-2018-0033961 filed on Mar. 23, 2018. The disclosure of each of the foregoing application is incorporated herein by reference in its entirety.

BACKGROUND

1. Field of Invention

Various embodiments of the present disclosure generally relate to an electronic device, and more particularly, to a memory controller and a method of operating the memory controller.

2. Description of Related Art

A memory device may have a two-dimensional (2D) structure in which strings are horizontally arranged on a semiconductor substrate, or a three-dimensional (3D) structure in which strings are vertically stacked on a semiconductor substrate. As the 2D memory device is reaching its physical scaling limit (i.e., limit in the degree of integration), semiconductor manufacturers are producing 3D memory devices. Either structural type of memory device typically operates under the control of a memory controller that controls the operation of the memory device in response to a request received from a host.

SUMMARY

Various embodiments of the present disclosure are directed to a memory controller having improved operation speed, and a method of operating the memory controller.

An embodiment of the present disclosure may provide for a memory controller. The memory controller may include a control component configured to control an operation of a semiconductor memory device including a plurality of memory cells in response to a request from a host. The control component may be configured to select a subset of memory cells, among all memory cells in a selected page of the semiconductor memory device, and to determine an optimal read voltage based on the select subset of memory cells.

An embodiment of the present disclosure may provide for a method of operating a memory controller to control a read operation of a semiconductor memory device. The method may include sensing threshold voltages of memory cells included in a selected page of the semiconductor memory device using a plurality of sensing voltages within a determined range, selecting memory cells to be used to determine an optimal read voltage from among the memory cells in the selected page, detecting a number of the selected memory cells having threshold voltages corresponding to each of a plurality of threshold voltage intervals, based on results of sensing of the threshold voltages, and determining a voltage corresponding to a threshold voltage interval, in which the number of selected memory cells is smallest, as an optimal read voltage.

An embodiment of the present disclosure may provide for a method of operating a memory controller to control a read operation of a semiconductor memory device. The method may include sensing threshold voltages of memory cells included in a selected page of the semiconductor memory device using a plurality of sensing voltages within a determined range, selecting first and second subsets of memory cells to be used to determine an optimal read voltage from among the memory cells included in the selected page, detecting a number of memory cells in the first subset and a number of memory cells in the second subset corresponding to each of the plurality of threshold voltage intervals based on results of sensing of the threshold voltages, determining a voltage corresponding to a threshold voltage interval, in which the number of memory cells in the first subset is smallest, as a first intermediate read voltage, and determining a voltage corresponding to a threshold voltage interval, in which the number of memory cells in the second subset is smallest, as a second intermediate read voltage, and determining the optimal read voltage based on the first and second intermediate read voltages.

An embodiment of the present disclosure may provide for a memory system including a memory device and a controller. The memory device may include a plurality of memory cells. The controller may be configured to select a page of the memory device, the page including a plurality of memory cells, sense threshold voltages for the plurality of memory cells, select memory cells among the plurality of memory cells, determine a number of memory cells among the selected memory cells for each of a plurality of voltage intervals corresponding to the threshold voltages, and determine an optimal read voltage based on the voltage interval, among the plurality of voltage intervals, in which the number of select memory cells is smallest.

DETAILED DESCRIPTION

Figure 1:
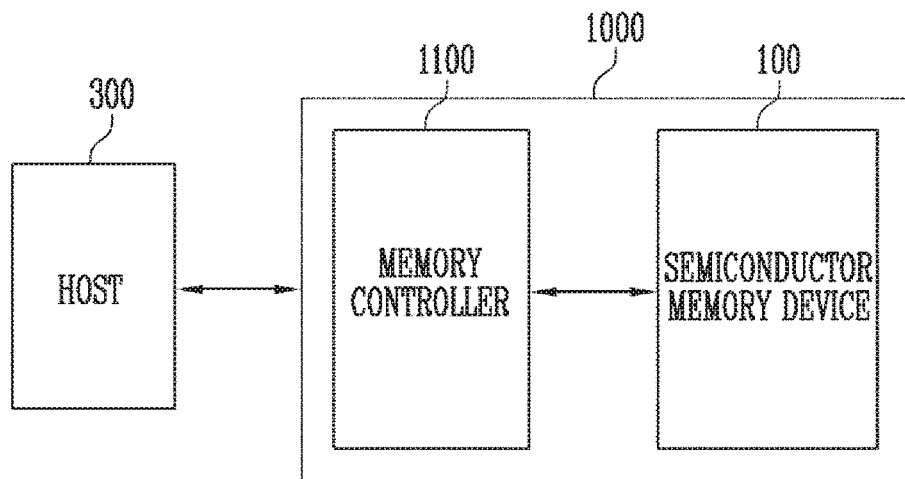
FIG. 1 is a block diagram illustrating a memory system.

Advantages and features of the present disclosure, and methods for achieving the same are described with reference to embodiments together with the accompanying drawings. Features and elements of the present disclosure may be arranged or configured differently than shown and described herein. This, the present invention is not limited to the following embodiments. Rather, these embodiments are provided so that the present disclosure is thorough and complete and fully conveys the scope of the disclosure to those skilled in the art. Also, throughout the specification, reference to "an embodiment," or the like is not necessarily to only one embodiment, and different references to any such phrase is not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, it does not preclude the presence or addition of another component, unless the context clearly indicates otherwise.

With respect to the drawings, the same reference numerals are is used throughout the different drawings to designate the same or similar components. Details of ell-known configurations and functions may be omitted to avoid unnecessarily obscuring the gist of the present disclosure.

FIG. 1 is a block diagram illustrating a memory system 1000.

Referring to FIG. 1, the memory system 1000 includes a semiconductor memory device 100 and a memory controller 1100.

The semiconductor memory device 100 is operated under the control of the memory controller 1100. In detail, the semiconductor memory device 100 writes data to a memory cell array in response to a write request received from the memory controller 1100. When a write command, an address, and data are received as the write request from the memory controller 1100, the semiconductor memory device 100 writes data to memory cells indicated by the address.

The semiconductor memory device 100 performs a read operation in response to a read request received from the memory controller 1100. When a read command and an address are received from the memory controller 1100, the semiconductor memory device 100 reads data from memory cells indicated by the address, and outputs the read data to the memory controller 1100.

The semiconductor memory device 100 may be implemented with a NAND flash memory, a vertical NAND flash memory (hereinafter referred to as 'VNAND'), a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM). The semiconductor memory device 100 may be implemented as a three-dimensional (3D) array structure. The present disclosure may also be applied not only to a flash memory device in which a charge storage layer is implemented with a conductive floating gate, but also to a charge trap flash (CTF) memory device in which a charge storage layer is implemented with an insulating layer.

The memory controller 1100 is coupled between the semiconductor memory device 100 and a host 300. The memory controller 1100 may interface the host 300 with the semiconductor memory device 100. The memory controller 1100 may receive a write request or a read request from the host 300, and transmit the received request to the semiconductor memory device 100.

Figure 2:
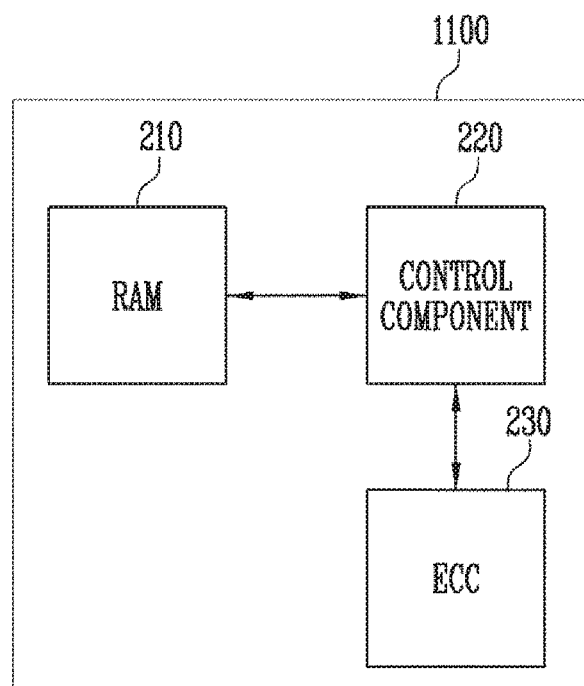
FIG. 2 is a block diagram illustrating a memory controller of FIG. 1.

FIG. 2 is a block diagram illustrating the memory controller 1100 of FIG. 1. Referring to FIG. 2, the memory controller 1100 includes a random access memory (RAM) 210, a control component 220, and an error correction code (ECC) circuit 230.

The RAM 210 may operate under the control of the control component 220, and may function as a work memory, a buffer memory, a cache memory, or the like. When the RAM 210 functions as a work memory, data that is processed by the control component 220 may be temporarily stored in the RAM 210. When the RAM 210 functions as a buffer memory, it may be used to buffer data to be transmitted from a host (e.g., 300 of FIG. 1) to the semiconductor memory device 100 or is from the semiconductor memory device 100 to the host. When the RAM 210 functions as a cache memory, the semiconductor memory device 100 may operate at high speed.

The control component 220 may control read, program, erase, and background operations of the semiconductor memory device 100. The control component 220 may run firmware for controlling the semiconductor memory device 100.

The control component 220 may translate a logical address provided by the host into a physical address through a flash translation layer (FTL) (not illustrated). In detail, the flash translation layer (FTL) may receive a logical address and translate the logical address into a physical address using a mapping table. The logical address may be a logical block address, and the physical address may be a physical page number. Examples of an address mapping method performed through the FTL may include various methods according to a mapping unit. Representative address mapping methods include a page mapping method, a block mapping method, and a hybrid mapping method.

The ECC circuit 230 generates parity which is an error correction code (ECC) for data to be programmed. Also, the ECC circuit 230 may correct an error in data (e.g., sensed page data) using the parity.

In various embodiments, the ECC circuit 230 may divide data to be programmed into a plurality of storage units (or chunks), and may generate parity for each chunk of data or storage unit. Alternatively, the ECC circuit 230 may generate parity for the entire data to be programmed.

During a program operation, when the ECC circuit 230 generates a parity bit, generates write data to which the parity bit is added, and transmits the write data to the control component 220, the control component 220 may transfer a program command, the write data, and a physical address to the semiconductor memory device 100.

During a read operation, the semiconductor memory device 100 may read page data from a page selected by the physical address in response to a read command, and may transmit the read page data to the memory controller 1100.

The ECC circuit 230 determines whether an error is included in the page data under the control of the control component 220. For example, the ECC circuit 230 may correct the error of the page data using parity. The ECC circuit 230 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

Generally, as the number of parity bits increases, the number of correctable error bits also increases. Therefore, more error bits in page data that also contains a larger number of parity bits may be corrected. When a number of error bits greater than a preset number of error bits are contained in the page data, decoding may fail. When a number of error bits less than or equal to the preset number are contained in the page data, decoding may succeed.

A success in decoding indicates that the corresponding read command has passed. A failure in decoding indicates that the corresponding read command has failed. When decoding succeeds, the memory controller 1100 may output error-corrected page data to the host.

Figure 3:
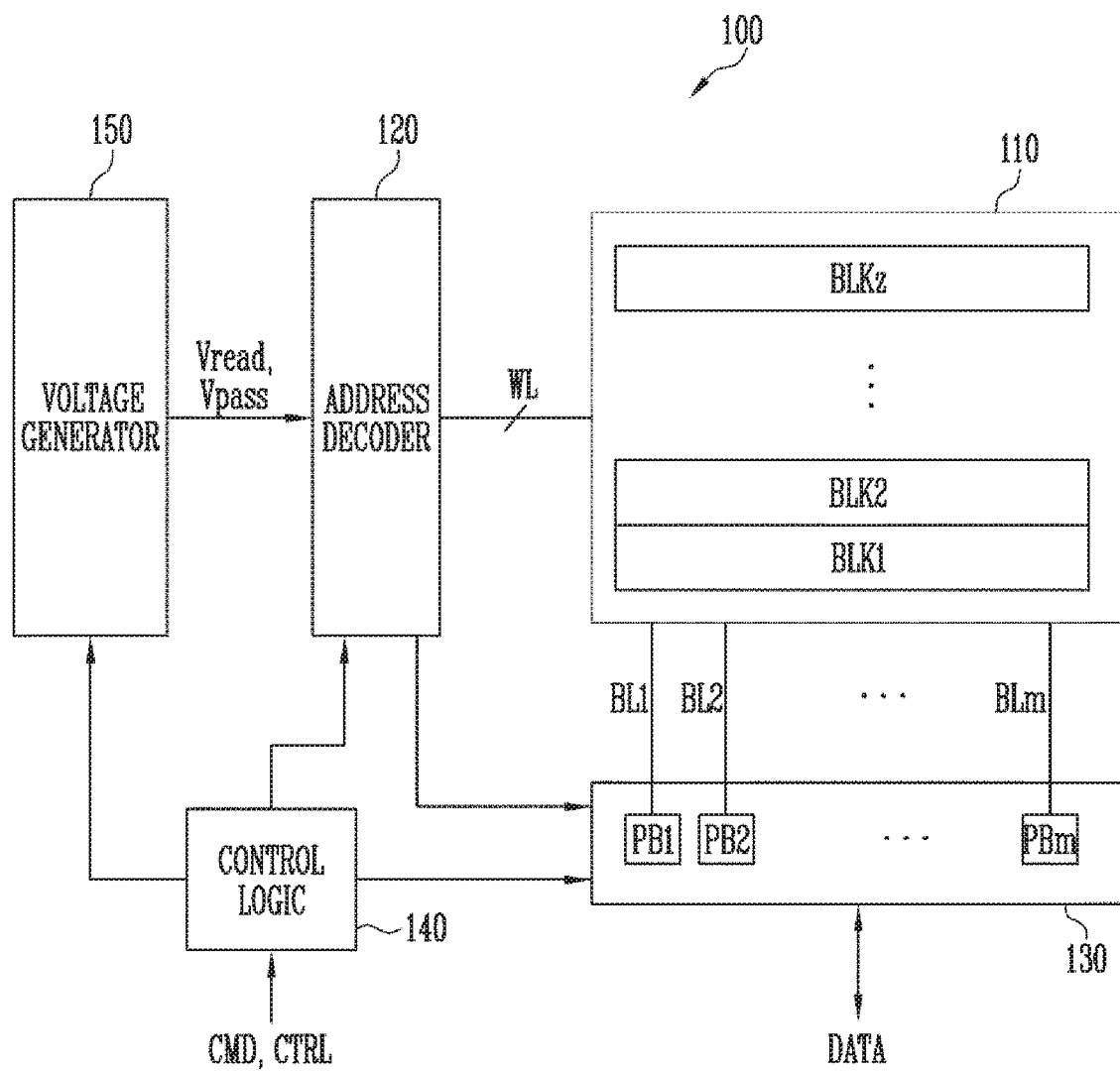
FIG. 3 is a block diagram illustrating a semiconductor memory device of FIG. 1.

FIG. 3 is a block diagram illustrating the semiconductor memory device 100 of FIG. 1.

Referring to FIG. 3, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells, for example, nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells included in the memory cell array may store at least one bit of data. In an embodiment, each of the memory cells in the memory cell array 110 may be a single-level cell (SLC), which stores one bit of data. In an embodiment, each of the memory cells in the memory cell array 110 may be a multi-level cell (MLC), which stores two bits of data. In an embodiment, each of the memory cells in the memory cell array 110 may be a triple-level cell (TLC), which stores three bits of data. In an embodiment, each of the memory cells in the memory cell array 110 may be a quad-level cell (QLC), which stores four bits of data. In various embodiments, the memory cell array 110 may include a plurality of memory cells, each of which stores 5 or more bits of data.

The address decoder 120, the read and write circuit 130, the control logic 140, and the voltage generator 150 are operated as peripheral circuits for driving the memory cell array 110. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to remaining unselected word lines. During a program verify operation, the address decoder 120 may apply a verify voltage, generated by the voltage generator 150, to a selected word line of a selected memory block, and may apply the pass voltage Vpass to remaining unselected word lines.

The address decoder 120 may decode a column address among the received addresses. The address decoder 120 may transmit the decoded column address to the read and write circuit 130.

The read and program operations of the semiconductor memory device 100 are each performed on a page basis. Addresses received at the request of read and program operations may include a block address, a row address and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, and an address buffer.

The read and write circuit 130 includes a plurality of page buffers PB1 to PBm. The read and write circuit 130 may operate as a read circuit during a read operation of the memory cell array 110 and as a write circuit during a write operation thereof. The plurality of page buffers PB1 to PBm are coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the program state of a corresponding memory cell and latches it as sensing data. The read and write circuit 130 operates in response to page buffer control signals outputted from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page resistors).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling a precharge potential level at the sensing node of the plurality of page buffers PB1 to PBm. The control logic 140 may control the read and write circuit 130 to perform a read operation of the memory cell array 110.

The voltage generator 150 may generate a read voltage Vread and a pass voltage Vpass required for a read operation in response to the control signal received from the control logic 140. The voltage generator 150 may include a plurality of pumping capacitors for receiving an internal supply voltage to generate a plurality of voltages having various voltage levels, and may generate a plurality of voltages by selectively enabling the plurality of pumping capacitors under the control of the control logic 140.

The address decoder 120, the read and write circuit 130, and the voltage generator 150 may function as peripheral circuits which perform a read operation, a write operation, and an erase operation on the memory cell array 110. The peripheral circuits may perform a read operation, a write operation, and an erase operation on the memory cell array 110 under the control of the control logic 140.

Figure 4:
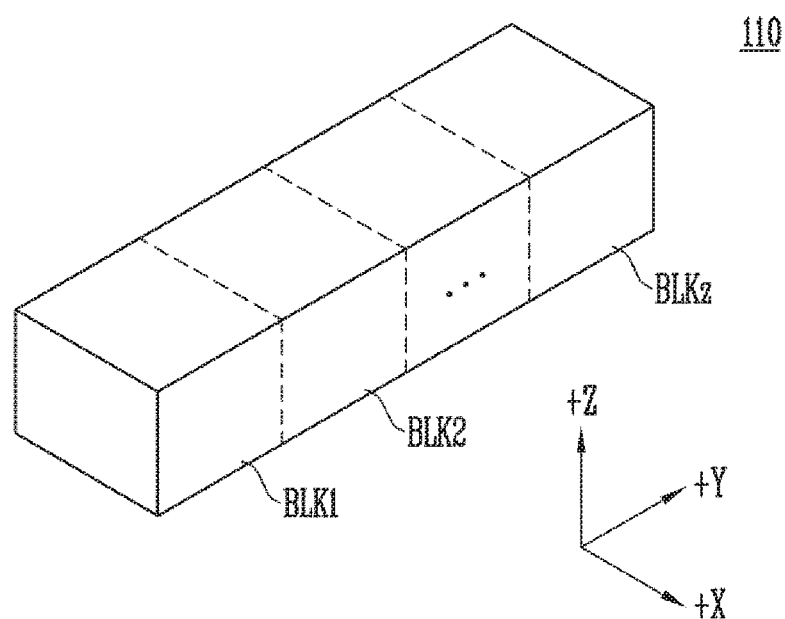
FIG. 4 is a diagram illustrating a memory cell array of FIG. 3.

FIG. 4 is a diagram illustrating the memory cell array 110 of FIG. 3.

Referring to FIG. 4, the memory cell array 110 includes a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block will be described in detail below with reference to FIGS. 5 and 6.

Figure 5:
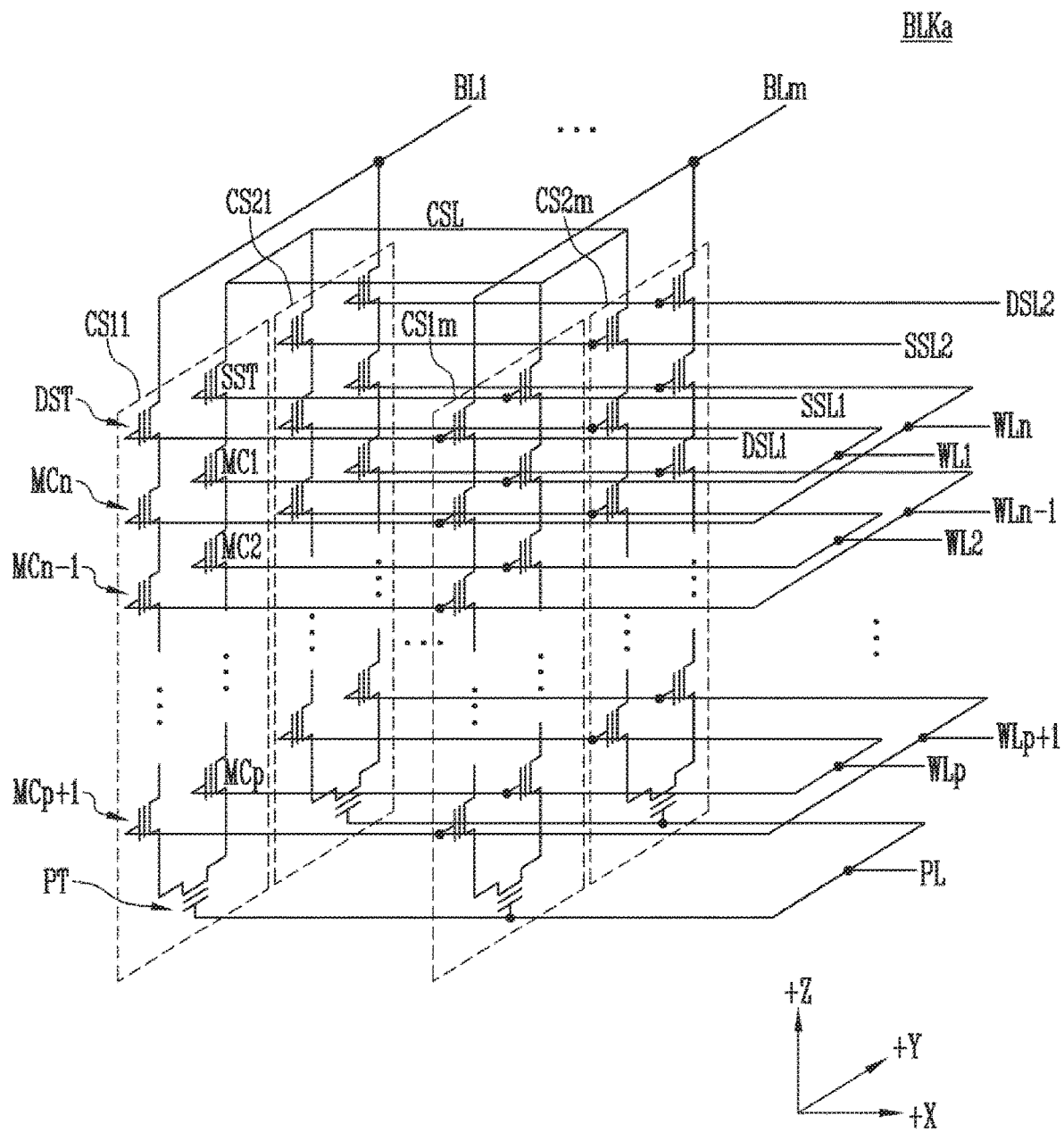
FIG. 5 is a circuit diagram illustrating a memory block of FIG. 3.

FIG. 5 is a circuit diagram illustrating a memory block, for example, a memory block, BLKa, of the memory blocks BLK1 to BLKz of FIG. 3.

Referring to FIG. 5, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e., positive (+) X direction). Although, in FIG. 5, two cell strings are illustrated as being arranged in a column direction (i.e., positive (+) Y direction), three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. Source select is transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1m and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a negative (−) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extended in a column direction. Cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, dummy memory cell(s) are provided to reduce an electric field between the source select transistor SST and the memory cells MC1 to MCp. Alternatively, the dummy memory cell(s) are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is decreased, but the reliability of the operation of the memory block BLKa may be deteriorated.

In order to efficiently control the dummy memory cell(s), each may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
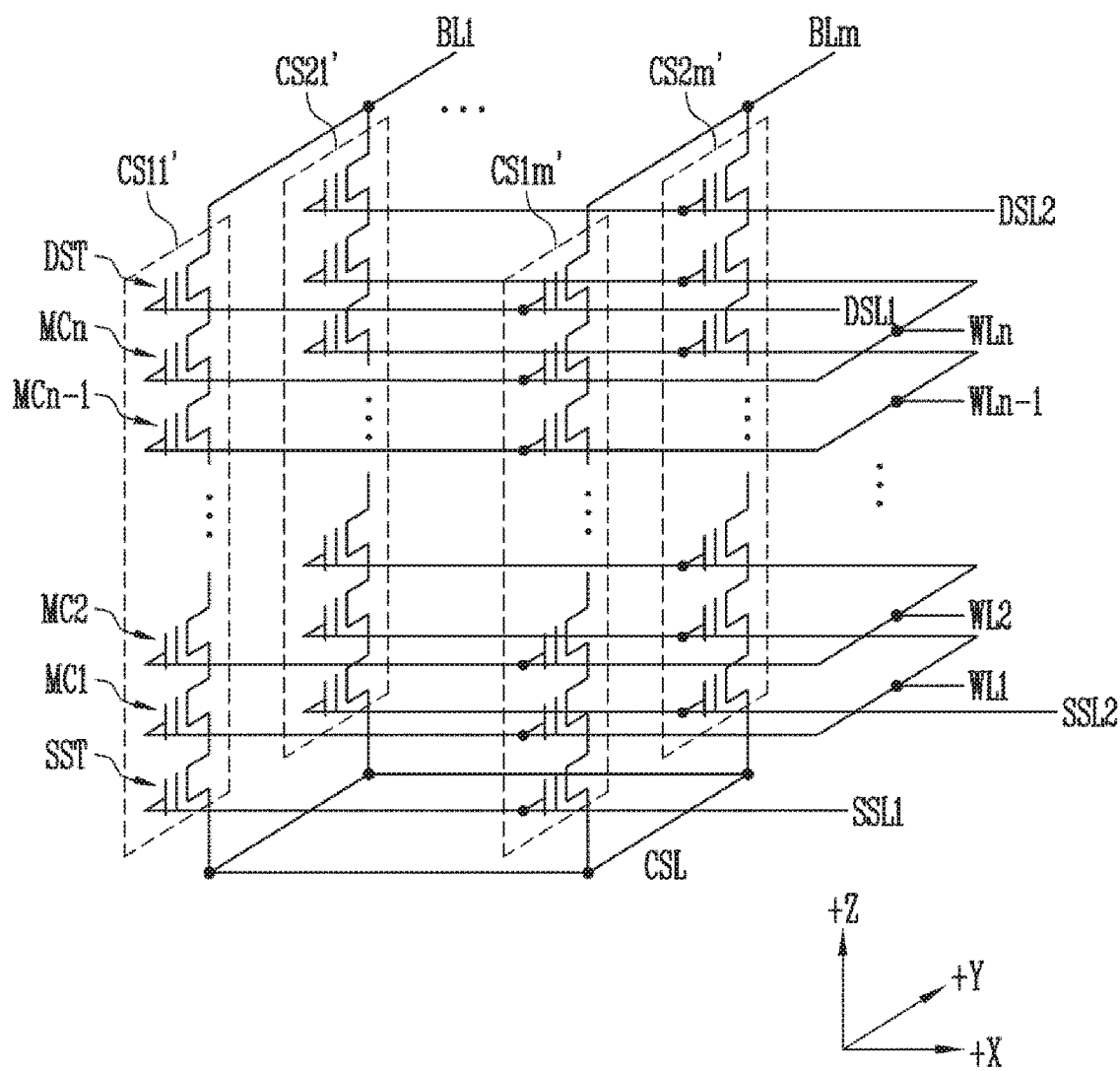
FIG. 6 is a circuit diagram illustrating a memory block of FIG. 4.

FIG. 6 is a circuit diagram lustrating a memory block, for example, a memory block BLKb of the memory blocks BLK1 to BLKz of FIG. 4.

Referring to FIG. 6, the memory block BLKb includes a plurality of cell strings CS11' to CS1$m$' and CS21' to CS2$m$'. Each of the plurality of cell strings CS11' to CSlm' and CS21' to CS2$m$' is extended along a positive Z (+Z) direction. Each of the cell strings CS11' to CS1$m$' and CS21' to CS2$m$' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1$m$'' arranged in a first row are coupled to a first source select line SSL1. Source select transistors of cell strings CS21' to CS2$m$' arranged in a second row are coupled to a second source select line SSL2. In an embodiment, source select transistors of the cell strings CS11' to CS1$m$' and CS21' to CS2$m$' may be coupled in common to a single source select line.

The first to nth memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

As a result, the memory block BLKb of FIG. 6 has an equivalent circuit similar to that of the memory block BLKa of FIG. 5 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1$m$' or CS21' to CS2$m$' arranged in a row direction, may be coupled to the even bit lines, respectively, and odd-numbered cell strings, among the cell strings CS11' to CS1$m$' or CS21' to CS2$m$' arranged in the row direction, may be coupled to the odd bit lines, respectively.

In an embodiment, one or more of the first to n-th memory cells MC1 to MCn may be used as dummy memory cells. For example, the dummy memory cell(s) are provided to reduce an electric field between the source select transistor SST and the memory cells MC1 to MCn. Alternatively, the dummy memory cell(s) are provided to reduce an is electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is decreased, but the reliability of the operation of the memory block BLKb may be deteriorated.

In order to efficiently control the dummy memory cell(s), each may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 7:
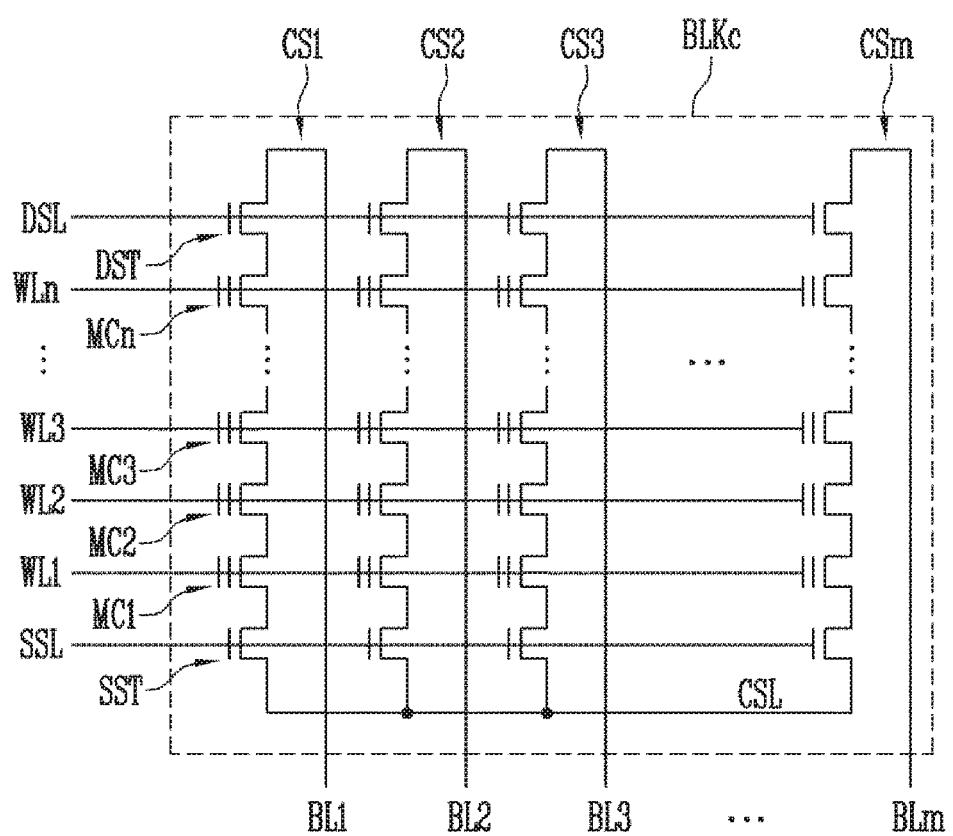
FIG. 7 is a circuit diagram illustrating a memory block included in a memory cell array of FIG. 3.

FIG. 7 is a circuit diagram illustrating a memory block, for example, a memory block, BLKc, of the memory blocks BLK1 to BLKz included in the memory cell array 110 of FIG. 3.

Referring to FIG. 7, the memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 4 to 6, the memory cell array 110 of the semiconductor memory device 100 may be implemented as a memory cell array having a 3D structure. Further, as illustrated in FIG. 7, the memory cell array 110 of the semiconductor memory device 100 may be implemented as a memory cell array having a 2D structure.

Figure 8A:
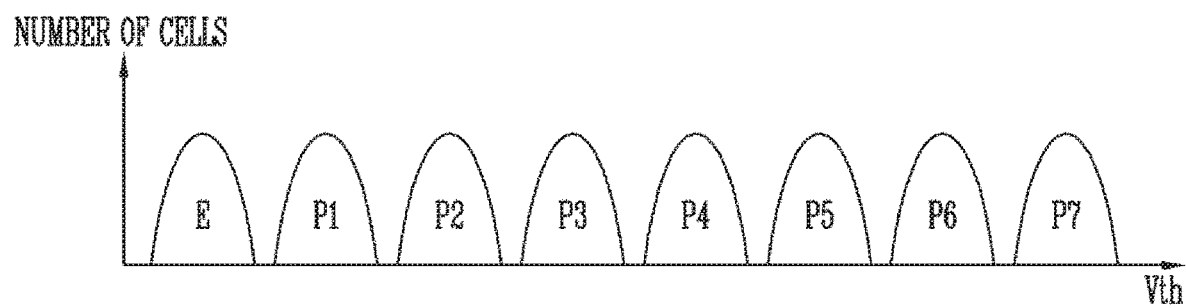
FIGS. 8A and 8B are diagrams illustrating threshold voltage distributions of memory cells.

FIGS. 8A and 83 are diagrams illustrating threshold voltage distributions of memory cells.

Referring to FIG. 8A threshold voltage distributions of memory cells are illustrated when a program operation performed on triple-level cells (TLC) is completed. For example, FIG. 8A illustrates threshold voltage distributions of memory cells which configure one physical page. As the triple-level cells are programmed, memory cells initially being in an erased state E have threshold voltages corresponding to the erased state E or any one of first to seventh program states P1 to P7. Threshold voltage distributions corresponding to respective states E and P1 to P7 are narrow immediately after a program operation is performed.

Figure 8B:
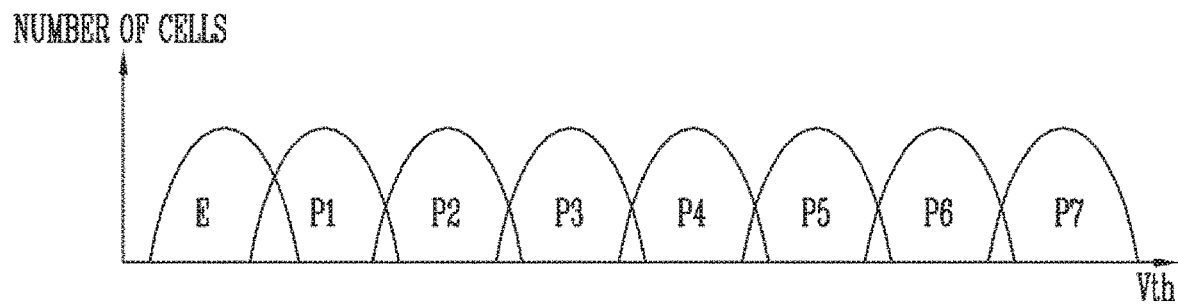

Referring to FIG. 8B, as time elapses after the program operation is performed, threshold voltage distributions corresponding to respective states E and P1 to P7 may be degraded due to retention, disturb or the like. In detail, as the threshold voltage distributions corresponding to respective states E and P1 to P7 are gradually widened, an overlap between the threshold voltage distributions corresponding to neighboring states may occur. In this case, in order to determine an optimal read voltage used to distinguish neighboring states from each other, the position of a valley between overlapping threshold voltage distributions may be detected. A method of determining an optimal read voltage between overlapping states will be described below with reference to FIG. 9.

Figure 9:
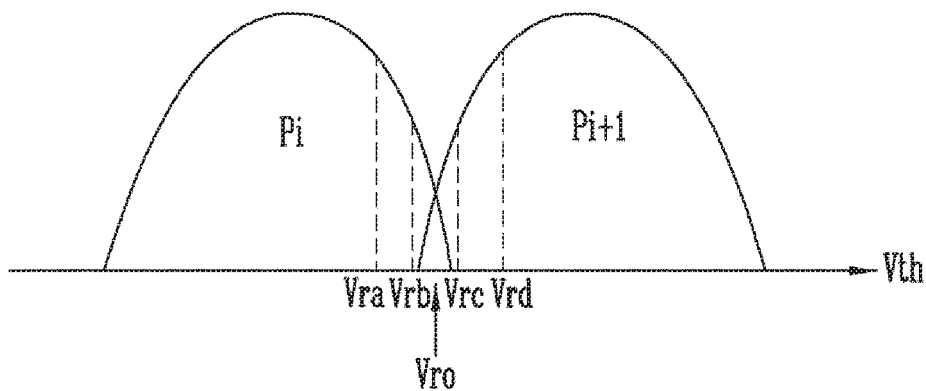
FIG. 9 is a diagram illustrating a method of determining an optimal read voltage between program states.

FIG. 9 is a diagram illustrating a method of determining an optimal read voltage between program states. Referring to FIG. 9, in order to determine an optimal read voltage Vro between an i-th program state Pi and an (i+1)-th program state Pi+1, a plurality of voltages Vra, Vrb, Vrc, and Vrd may be sequentially used. As the plurality of voltages Vra, Vrb, Vrc, and Vrd are applied, the number of memory cells present in each threshold voltage interval may be calculated.

For example, the number of memory cells, the threshold voltages of which are in an interval from Vra to Vrb may be calculated using the following method. When the voltage Vra is applied, the number of memory cells that are turned off may be the number of memory cells distributed to the right side of the voltage Vra, whereas the number of memory cells that are turned on may be the number of memory cells distributed to the left side of the voltage Vra. When the voltage Vrb is applied, the number of memory cells that are turned off may be the number of memory cells distributed to the right side of the voltage Vrb, whereas the number of memory cells that are turned on may be the number of memory cells distributed to the left side of the voltage Vrb.

Accordingly, when the number of memory cells that are turned off is when the voltage Vrb is applied is subtracted from the number of memory cells that are turned off when the voltage Vra is applied, the number of memory cells in the interval from Vra to Vrb may be calculated. Alternatively, the same result may be obtained even when the number of memory cells that are turned on when the voltage Vra is applied is subtracted from the number of memory cells that are turned on when the voltage Vrb is applied.

Through the above-described scheme, the number of memory cells in each of the intervals from Vra to Vrb, from Vrb to Vrc, and from Vrc to Vrd is calculated, and thus the interval including the smallest number of memory cells is selected. In FIG. 9, the interval from Vrb to Vrc may be selected. A suitable voltage present in the selected interval is determined to be an optimal read voltage Vro. In an embodiment, the optimal read voltage Vro may be determined to be the intermediate value of values in the interval from Vrb to Vrc. In this case, the optimal read voltage Vro may be determined to be the average value of the voltages Vrb and Vrc.

However, even if the method illustrated in FIG. 9 is used, when an overlap between program states is significant, it may be difficult to detect an optimal read voltage. Further, in order to more accurately detect the position of a valley, each interval should be minutely set. In this case, since more read voltages should be applied, the entire read speed may be deteriorated.

In various embodiments, some memory cells may be selected is from among memory cells included in a page selected as the target of a read operation, and then an optimal read voltage may be calculated based on the threshold voltages of the selected memory cells. Accordingly, the optimal read voltage may be determined using fewer computations, and the operation speed of the memory system 1000 may be improved.

Figure 10:
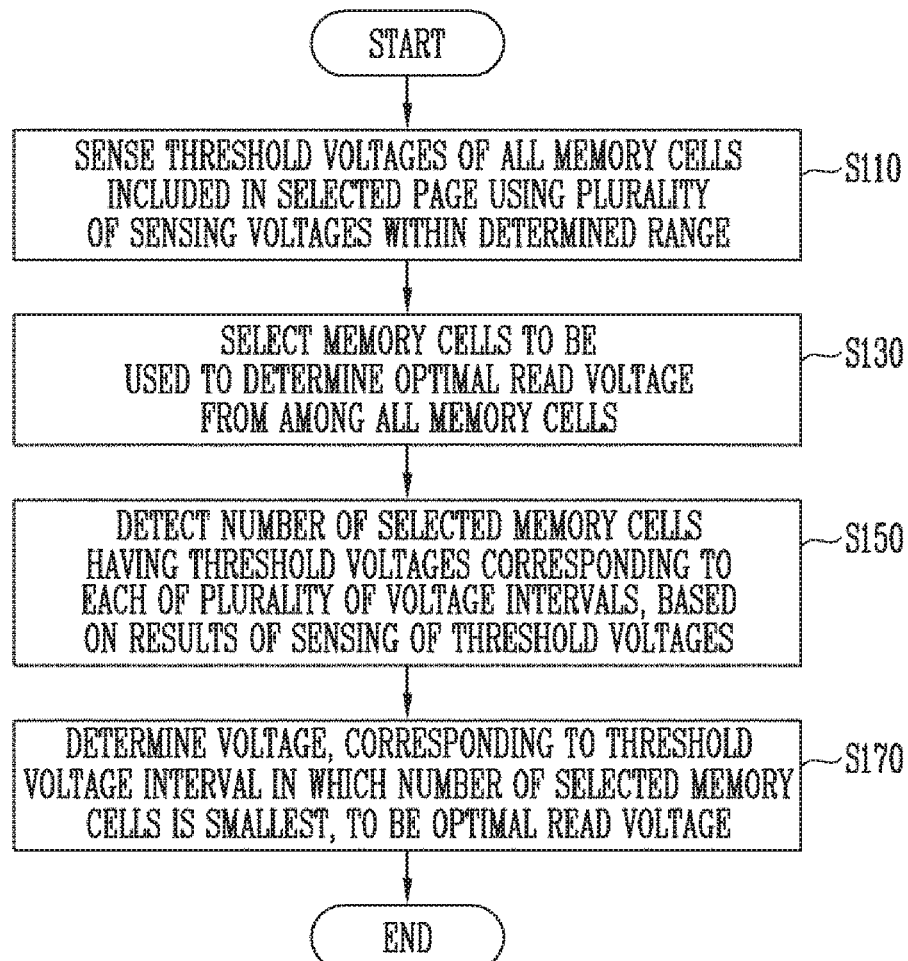
FIG. 10 is a flowchart illustrating a method of operating a memory controller according to an embodiment of the present disclosure.

FIG. 10 is a flowchart illustrating a method of operating a memory controller, for example, the memory controller 1100 of FIG. 1., according to an embodiment of the present disclosure.

At step S110, the threshold voltages of all memory cells in a selected page are sensed using a plurality of sensing voltages within a determined range. As described above with reference to FIG. 9, a plurality of voltages Vra, Vrb, Vrc, and Vrd are sequentially applied to all memory cells in the page selected as the target of a read operation. When the voltages are sequentially applied to the memory cells, which memory cells turn-on and which turn-off are sensed. In detail, the memory controller 1100 may control the semiconductor memory device 100 so that the turn-on or turn-off results of the memory cells are sensed by applying the plurality of voltages Vra, Vrb, Vrc, and Vrd. The semiconductor memory device 100 may transfer the sensed results to the memory controller 1100.

At step S130, a partial amount, or a subset of, memory cells to be used to determine an optimal read voltage are selected from among all the memory cells. The selected memory cells may include some or all is memory cells in the page selected as the target of the read operation. Step S130 of selecting the memory cells will be described later with reference to FIGS. 11A and 11B.

Although, in FIG. 10, step S130 is illustrated as being performed after step S110 has been performed, the method of operating the memory controller 1100 is not limited thereto. For example, step S110 may be performed after step S130 has been performed, or steps S110 and S130 may be simultaneously performed.

Thereafter, at step S150, the number of selected memory cells having threshold voltages corresponding to each of a plurality of threshold voltage intervals is detected based on the results of sensing of the threshold voltages. For the selected memory cells selected at step S130, the number of memory cells in each of the intervals from Vra to Vrb, from Vrb to Vrc, and from Vrc to Vrd may be calculated, as described with reference to FIG. 9.

Thereafter, at step S170, the voltage corresponding to the threshold voltage interval in which the number of selected memory cells is the smallest is determined to be the optimal read voltage. At step S170, a threshold voltage interval in which the number of memory cells is the smallest is selected first. In the example of FIG. 9, the interval from Vrb to Vrc may be selected. Thereafter, the optimal read voltage in the interval from Vrb to Vrc is determined. In an example, the intermediate value of voltages in the interval from Vrb to Vrc may be determined to be the optimal read voltage Vro. A method of determining the optimal read is voltage within the interval from Vrb to Vrc may be performed in various ways.

When the optimal read voltage Vro is determined, the read operation of the semiconductor memory device may be performed based on the determined optimal read voltage.

Although the method of determining a single read voltage, among a plurality of optimal read voltages, is illustrated in FIG. 9, more than one optimal read voltage may be determined using the above-described method. For example, in the case of read voltages for multi-level cells, three read voltages may be determined using the method illustrated in FIG. 9. In other examples, in the case of read voltages for triple-level cells, seven read voltages may be determined using the method illustrated in FIG. 9.

In various embodiments, an optimal read voltage is determined for select memory cells corresponding to some of all memory cells in a physical page selected as the target of a read operation. When random data is programmed to all memory cells of the physical page, data programmed to select memory cells indicating some of all the memory cells may be random data. Therefore, the statistical characteristics of threshold voltage distributions attributable to retention or disturb may be substantially identical for all memory cells and for select memory cells in the selected page. Therefore, the optimal read voltage determined for select memory cells in the selected page may act as the optimal read voltage even for all the memory cells. Accordingly, the time required to calculate the optimal read voltage may be shortened while the accuracy of is the optimal read voltage may be improved.

Figure 11A:
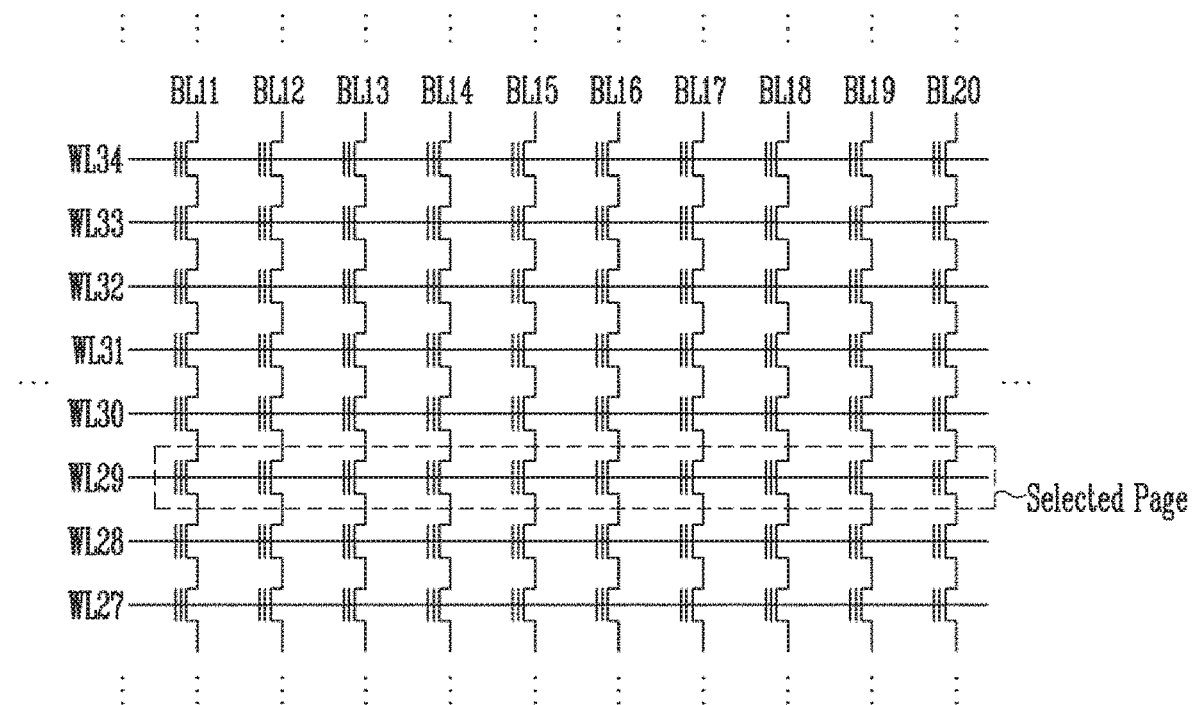
FIGS. 11A and 11B are diagrams illustrating examples of selecting memory cells from a selected page for determining an optimal read voltage according to an embodiment of the present disclosure.
Figure 11B:
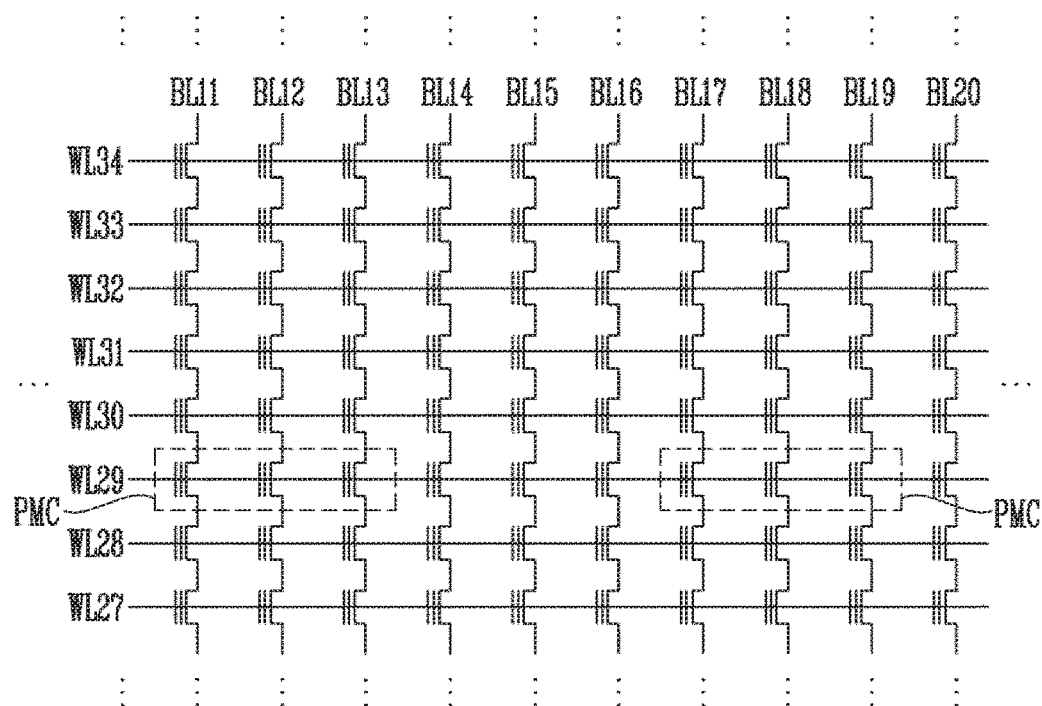

FIGS. 11A and 11B are diagrams illustrating examples of selecting some memory cells from a selected page. FIGS. 11A and 11B are corresponding to the step S130 of FIG. 10.

Referring to FIGS. 11A and 11B, a part of a memory block BLK is illustrated. In detail, memory cells defined by 27-th to 34-th word lines WL27 to WL34 and 11-th to 20-th bit lines BL11 to BL20 of the memory block BLK are illustrated.

In FIG. 11A, a page which is selected as the target of a read operation includes memory cells coupled to a 29-th word line WL29. That is, m memory cells defined by the 29-th word line WL29 and the first to m-th bit lines BL1 to BLm are included in the page selected as the target of the read operation.

In FIG. 11B, among all memory cells in the page selected as the target of the read operation, a partial amount, or subset of, memory cells PMC to be used to determine an optimal read voltage are illustrated. Among m memory cells defined by the 29-th word line WL29 and the first to m-th bit lines BL1 to BLm, some memory cells may be selected as the memory cells PMC. In detail, three memory cells coupled to 11-th to 13-th bit lines BL11 to BL13 and three memory cells coupled to 17-th to 19-th bit lines BL17 to BL19 are illustrated as being selected as the memory cells PMC. Since this illustration is merely exemplary, memory cells PMC may be selected using various different methods. In this case, the memory cells PMC may be selected such that the statistical characteristics is thereof are similar to those of all memory cells included in the selected physical page.

Figure 12A:
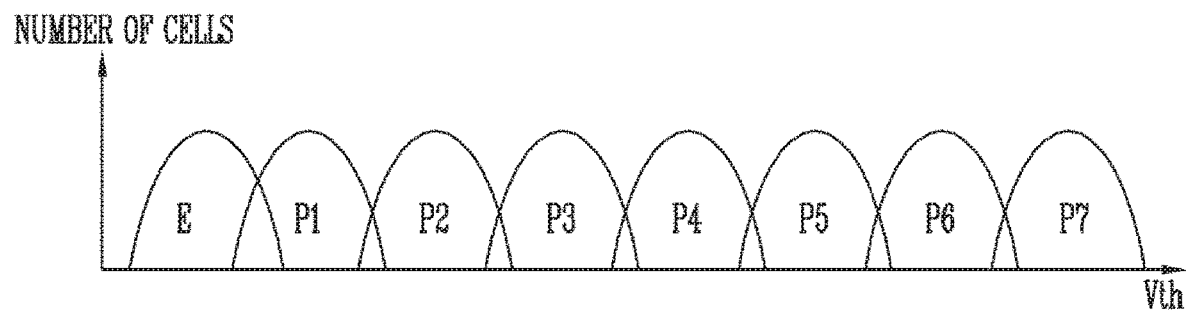
FIGS. 12A to 12C are diagrams illustrating threshold voltage distributions of select memory cells and the detection of an optimal read voltages according to an embodiment of the present disclosure.
Figure 12B:
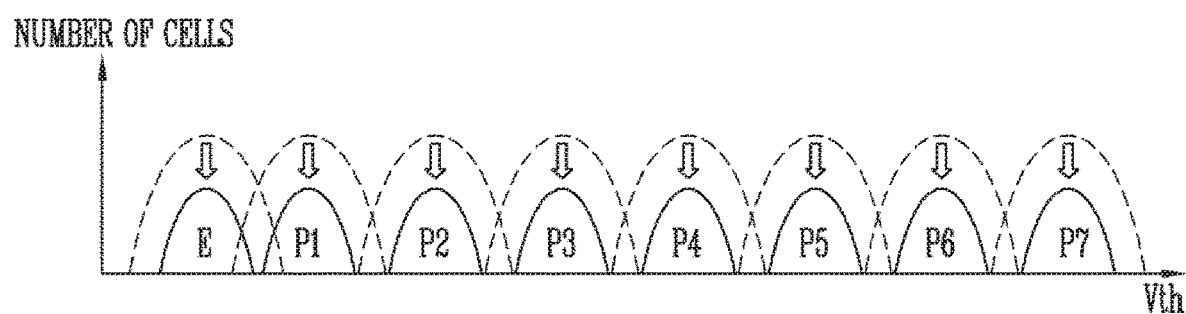
Figure 12C:
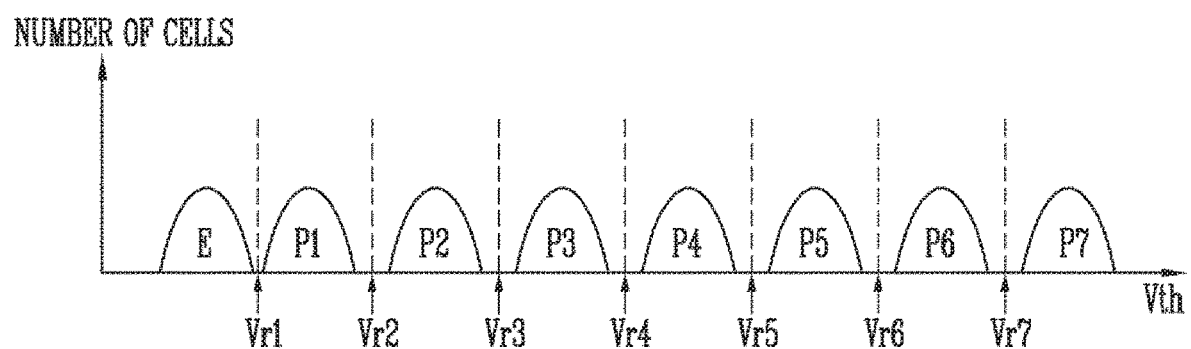

FIGS. 12A to 12C are diagrams illustrating threshold voltage distributions of memory cells PMC and the detection of an optimal read voltage.

Referring to FIG. 12A, the threshold voltage distributions of all memory cells included in a selected page, for example, the selected page shown in FIG. 11A, are illustrated. As described above with reference to FIG. 8B, when an optimal read voltage is determined for degraded threshold voltage distributions, an operation time may be delayed, and thus the read speed of a memory system 1000 may be deteriorated.

Referring to FIG. 12B, the threshold voltage distributions of select memory cells, for example, memory cells PMC shown in FIG. 11B, are illustrated. Since the select memory cells are some of all memory cells in a page, the number of memory cells corresponding to each of states E and P1 to P7 is less than the total number of memory cells. Accordingly, compared to the threshold voltage distributions of all memory cells (indicated by dotted lines in FIG. 123), the threshold voltage distributions of select memory cells (indicated by solid lines in FIG. 123) may be more clearly distinguished from each other between neighboring states.

Referring to FIG. 12C, optimal read voltages Vr1 to Vr7 detected for the threshold voltage distributions of select memory cells are illustrated. In FIG. 12A, overlaps are present between neighboring threshold voltage distributions of all memory cells. In contrast, in FIG. 12C, no overlaps are present between neighboring threshold voltage distributions of select memory cells (or overlaps between the threshold voltage distributions of select memory cells may be mitigated).

Accordingly, compared to a procedure for detecting optimal read voltages for all memory cells, a procedure for detecting optimal read voltages for select memory cells may be performed within a shorter period of time. Accordingly, the operation speed of the memory system 1000 may be improved.

Figure 13:
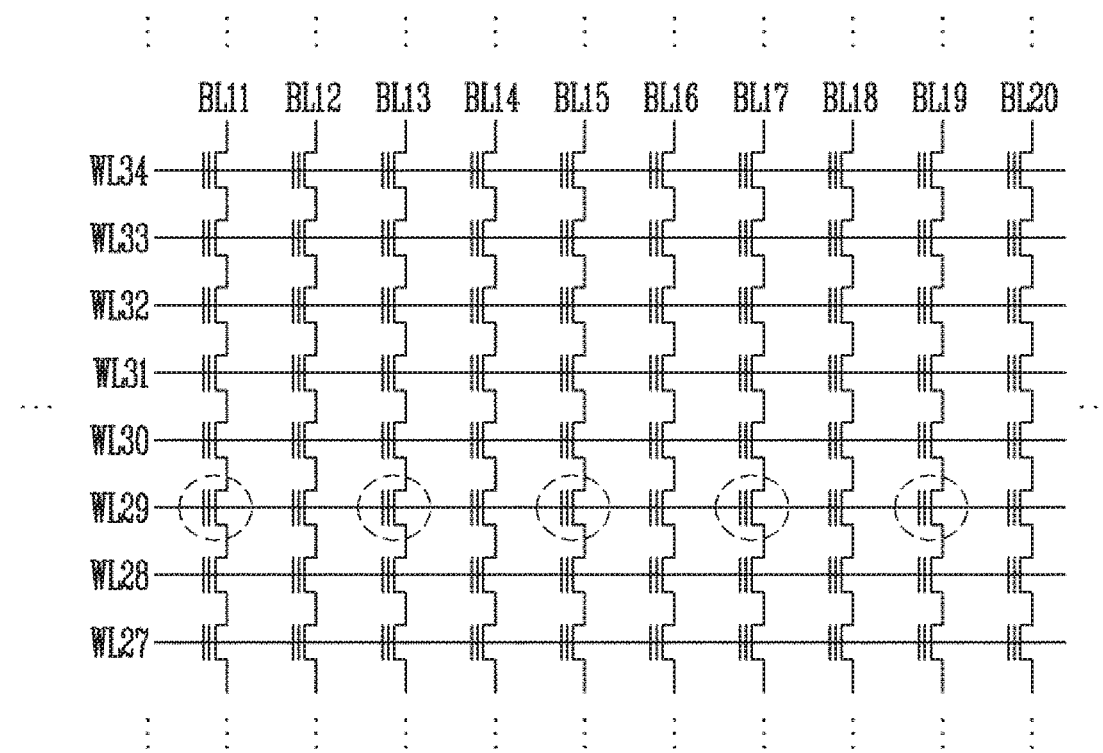
FIG. 13 is a diagram illustrating selecting of memory cells according to an embodiment of the present disclosure.

FIG. 13 is a diagram illustrating which memory cells are selected to determine the optimal read voltage(s). Comparing FIGS. 13 and 113, FIG. 11B illustrates an example in which three consecutive memory cells are selected as memory cells PMC, whereas FIG. 13 illustrates an example in which memory cells coupled to odd bit lines (e.g., BL11, BL13, BL15, BL17 and BL19) are selected as memory cells PMC. FIG. 13 is merely exemplary; memory cells PMC in the selected page may be selected using various different methods. For example, an arbitrary number of memory cells, randomly selected from among memory cells in the selected page, may be selected as the memory cells PMC.

Figure 14:
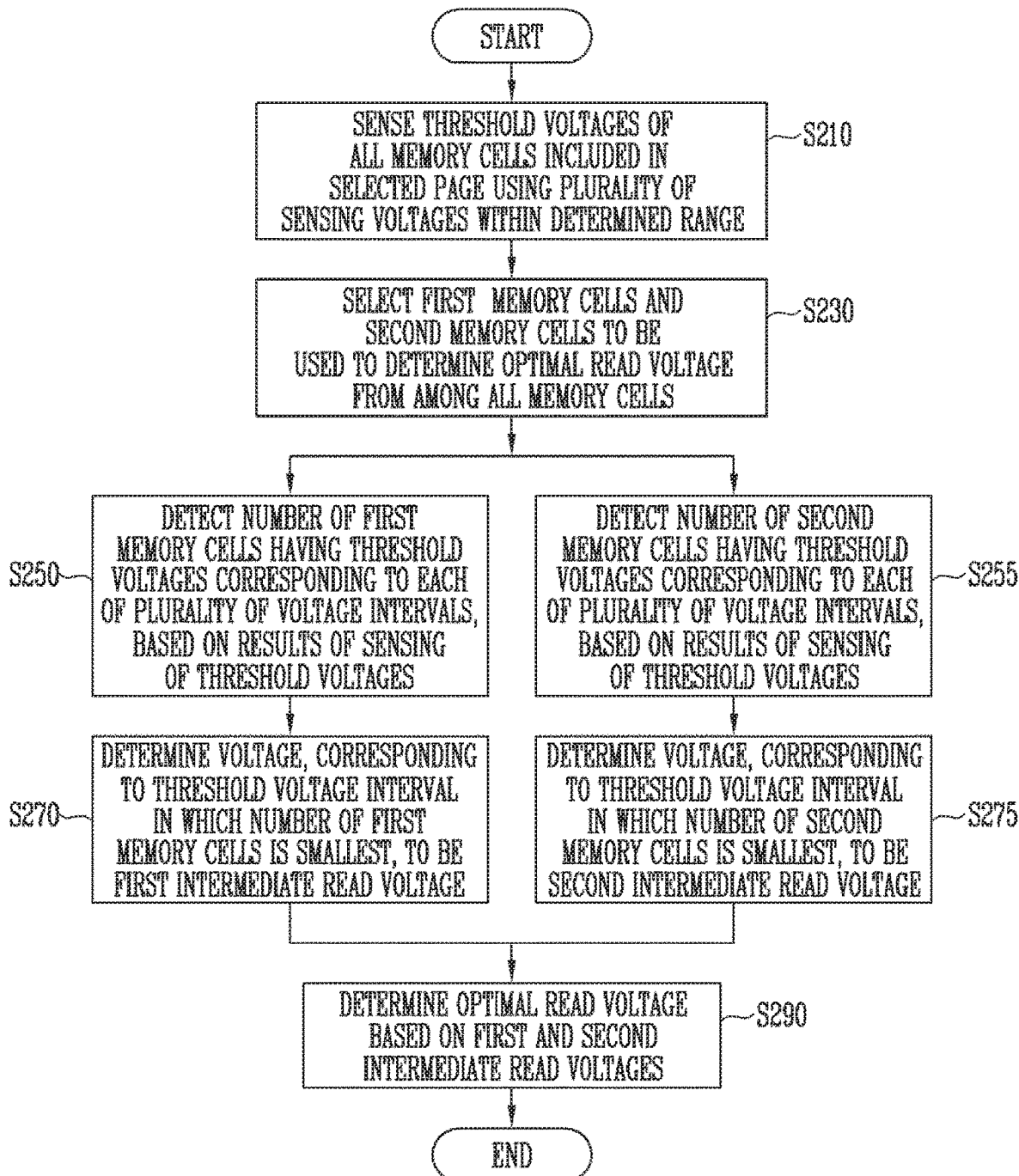
FIG. 14 is a flowchart illustrating a method of operating a memory controller according to an embodiment of the present disclosure.

FIG. 14 is a flowchart illustrating a method of operating a memory controller, for example, the memory controller 1100 according to an embodiment of the present disclosure.

At step S210, the threshold voltages of all memory cells included in a selected page are sensed using a plurality of sensing voltages within a determined range. Step S210 may be performed in substantially the is same way as step S110 of FIG. 10. As described above with reference to FIG. 9, a plurality of voltages Vra, Vrb, Vrc, and Vrd are sequentially applied to all memory cells in the page selected as the target of a read operation, and the turn-on or turn-off results of the memory cells are sensed when respective voltages are applied to the memory cells. In detail, the memory controller 1100 may control a semiconductor memory device 100 so that the turn-on or turn-off results of the memory cells are sensed by applying the plurality of voltages Vra, Vrb, Vrc, and Vrd to the memory cells. The semiconductor memory device 100 may transfer the sensed results to the memory controller 1100.

At step S230, a first subset of memory cells and a second subset of memory cells to be used to determine an optimal read voltage are selected from among all the memory cells. The first subset of memory cells and the second subset of memory cells may include some memory cells among all the memory cells in the page selected as the target of the read operation.

The first subset of memory cells and the second subset of memory cells may be mutually exclusive subsets. For example, among the memory cells in the selected page, memory cells coupled to odd bit lines may be selected as the first subset of memory cells, and memory cells coupled to even bit lines may be selected as the second subset of memory cells. In this case, the memory cells in the first subset are not included in the second subset.

Alternatively, some of the memory cells in the first subset may be is included in the second subset. For example, among the memory cells in the selected page, memory cells coupled to 3i-th bit lines BL(3i) (i.e., BL3, BL6, BL9, . . . ) may be in the first subset of memory cells, and memory cells coupled to 4j-th bit lines BL(4j) (i.e., BL4, BL5, BL12, . . . ) may be in the second subset of memory cells (where i and j are natural numbers). In this case, some of the memory cells in the first subset (e.g., BL12, BL24, . . . ) may be included in the second subset.

Thereafter, steps S250 and S270 may be performed on the first subset of memory cells, and steps S255 and 275 may be performed on the second subset of memory cells.

At step S250, the number of memory cells in the first subset having threshold voltages corresponding to each of a plurality of threshold voltage intervals is detected based on the results of sensing of the threshold voltages. For the memory cells selected in the first subset at step S230, the number of memory cells in each of the intervals from Vra to Vrb, from Vrb to Vrc, and from Vrc to Vrd may be calculated, as described with reference to FIG. 9.

In parallel with step S250, step S255 may be performed. At step S255, the number of memory cells in the second subset having threshold voltages corresponding to each of a plurality of threshold voltage intervals is detected based on the results of sensing of the threshold voltages.

At step S270, a voltage corresponding to a threshold voltage interval in which the number of memory cells in the first subset is the smallest is determined to be a first intermediate read voltage. A is procedure for making the determination of step S270 may be performed in substantially the same way as that of step S170 of FIG. 10, which includes determining the optimal read voltage for the first partial memory cells. At step S275, a voltage corresponding to a threshold voltage interval in which the number of memory cells in the second subset is the smallest is determined to a second intermediate read voltage. A procedure for making the determination of S275, may be performed in substantially the same way as that of step S170 of FIG. 10, which includes determining the optimal read voltage for the second memory cells.

At step S290, an optimal read voltage may be finally determined based on the first intermediate read voltage and the second intermediate read voltage. The optimal read voltage may be determined based on the first intermediate read voltage and the second intermediate read voltage in various ways. In an example, an arithmetic mean of the first intermediate read voltage and the second intermediate read voltage may be determined to be the optimal read voltage.

In FIG. 14, an embodiment is illustrated in which memory cells of two subsets, that is, memory cells of the first subset and memory cells of the second subset, are selected and then an optimal read voltage is determined. However, the number of subsets is not limited to two. For example, memory cells may be selected from three or more subsets and then three or more intermediate read voltages may be determined, after which the optimal read voltage may be determined based on the intermediate read voltages.

As described above, an optimal read voltage is determined for select memory cells corresponding to some of all memory cells which are included in a physical page selected as the target of a read operation. When random data is programmed to all memory cells of the physical page, data programmed to select memory cells indicating some of all the memory cells may be random data. Therefore, the statistical characteristics of threshold voltage distributions attributable to retention or disturb may be substantially identical for all memory cells and for select memory cells in the selected page. Therefore, the optimal read voltage determined for select memory cells in the selected page may act as the optimal read voltage even for all the memory cells. Accordingly, the time required to calculate the optimal read voltage may be shortened while the accuracy of the optimal read voltage may be improved.

Figure 15:
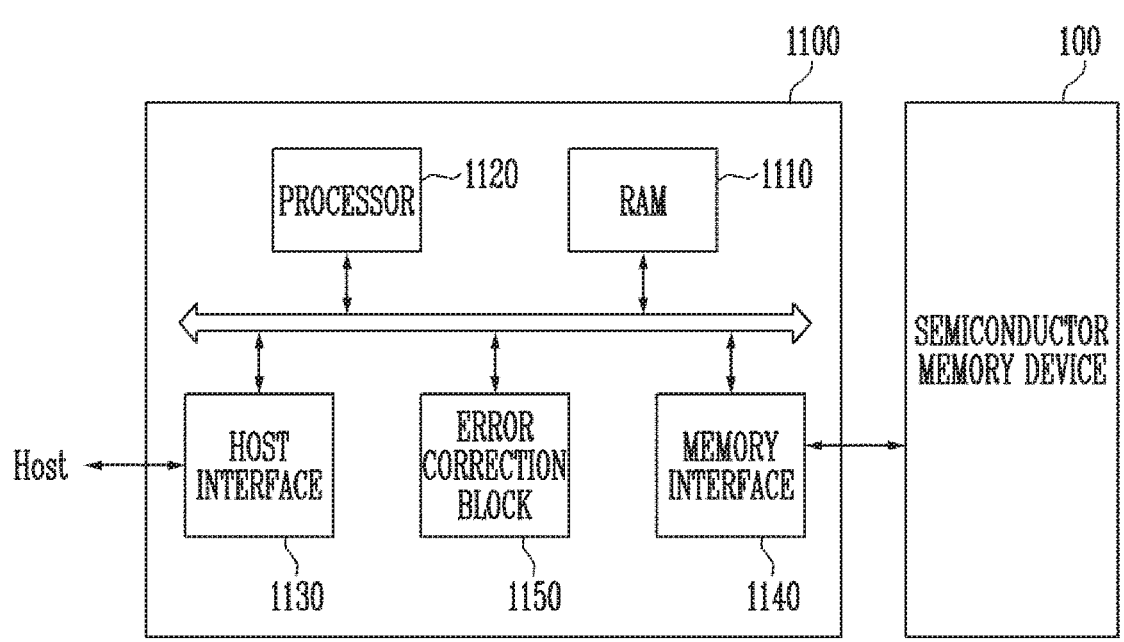
FIG. 15 is a block diagram illustrating an example of the memory system of FIG. 1 according to an embodiment of the present disclosure.

FIG. 15 is a block diagram illustrating an example of the memory system 1000 of FIG. 1.

Referring to FIG. 15, the memory system 1000 includes a semiconductor memory device 100 and a memory controller 1100. The semiconductor memory device 100 may be the semiconductor memory device described with reference to FIGS. 1 and 3, and the memory controller 1100 may be the memory controller described with reference to FIGS. 1 and 2.

The memory controller 1100 is coupled to a host (Host) and the semiconductor memory device 100. The memory controller 1100 may correspond to the memory controller 1100 of FIGS. 1 and 2. The memory controller 1100 may access the semiconductor memory device 100 in response to a request from the host. For example, the memory controller 1100 may control read, write, erase, and background operations of the semiconductor memory device 100. The memory controller 1100 may provide an interface between the host and the semiconductor memory device 100. The memory controller 1100 may run firmware for controlling the semiconductor memory device 100.

The memory controller 1100 may include a random access memory (RAM) 1110, a processor 1120, a host interface 1130, a memory interface 1140, and an error correction block 1150. The RAM 1110 may correspond to the RAM 210 of FIG. 2. The RAM 1110 may function as at least one of a work memory for the processor 1120, a cache memory between the semiconductor memory device 100 and the host, and a buffer memory between the semiconductor memory device 100 and the host. The processor 1120 may control the overall operation of the memory controller 1100. The processor 1120 may correspond to the control component 220 of FIG. 2. In addition, the memory controller 1100 may temporarily store program data provided from the host during a write operation.

The host interface 1130 includes a protocol for performing data exchange between the host and the memory controller 1100. In an embodiment, the memory controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processor 1120 may adjust the read voltage based on the result of error detection by the error correction block 1150, and may control the semiconductor memory device 100 to perform re-reading. In an embodiment, the error correction block 1150 may be provided as an element of the memory controller 1100. The error correction block 1150 may correspond to the error correction code (ECC) circuit 230 of FIG. 2.

The memory controller 1100 and the semiconductor memory device 100 may be integrated into a single semiconductor device. In an embodiment, the memory controller 1100 and the semiconductor memory device 100 may be integrated into a single semiconductor device to form a memory card such as a personal computer memory card international association (PCMCIA), a compact flash card (CF), a smart media card (SM or SMC), a memory stick, a multimedia card (e.g., MMC, RS-MMC, or MMCmicro), a SD card (e.g., SD, miniSD, microSD, or SDHC), or a universal flash storage (UFS).

The memory controller 1100 and the semiconductor memory device 100 may be integrated into a single semiconductor device to form a solid state drive (SSD). The SSD includes a storage device configured to store data in a semiconductor memory. When the memory system 1000 is used as the SSD, the operation speed of the host coupled to the memory system 1000 may be phenomenally improved.

In other embodiments, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 16:
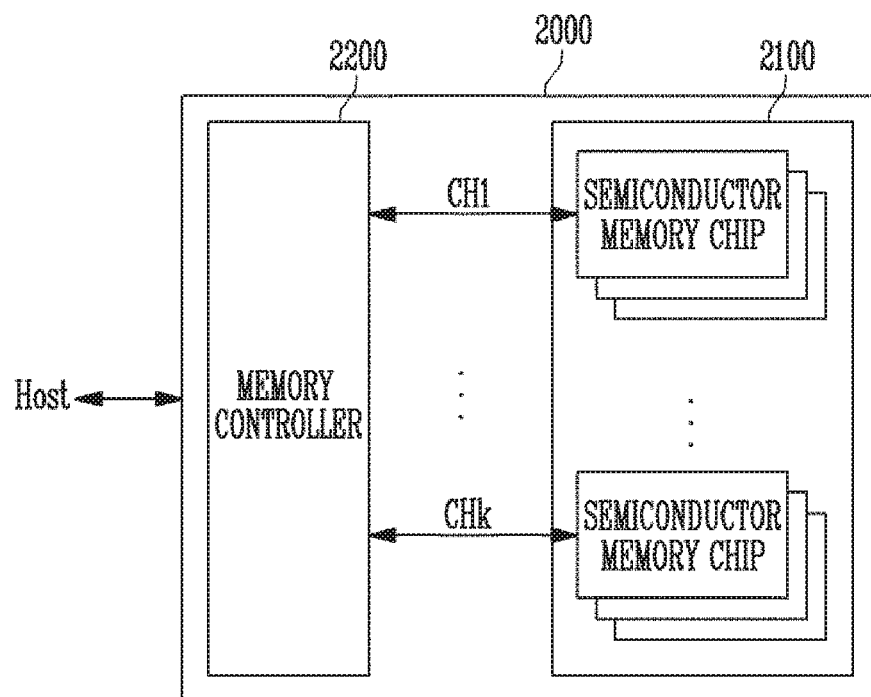
FIG. 16 is a block diagram illustrating an exemplary application of the memory system of FIG. 15 according to an embodiment of the present disclosure.

FIG. 16 is a block diagram illustrating an example of application of the memory system 1000 of FIG. 15.

Referring to FIG. 16, a memory system 2000 includes a semiconductor memory device 2100 and a memory controller 2200. The semiconductor memory device 2100 includes a plurality of semiconductor memory chips. The semiconductor memory chips are divided into a plurality of groups.

In FIG. 16, it is illustrated that each of k groups of semiconductor memory chips communicates with the memory controller 2200 through a respective one of first to k-th channels CH1 to CHk. Each semiconductor memory chip may have the same configuration and operation as the semiconductor memory device 100 described with reference to FIG. 3.

Each chip in a group communicates with the memory controller 2200 through one common channel. The memory controller 2200 may have the same configuration as the memory controller 1100 described with reference to FIG. 15, and may control the plurality of memory chips of the semiconductor memory device 2100 through the plurality of channels CH1 to CHk.

Figure 17:
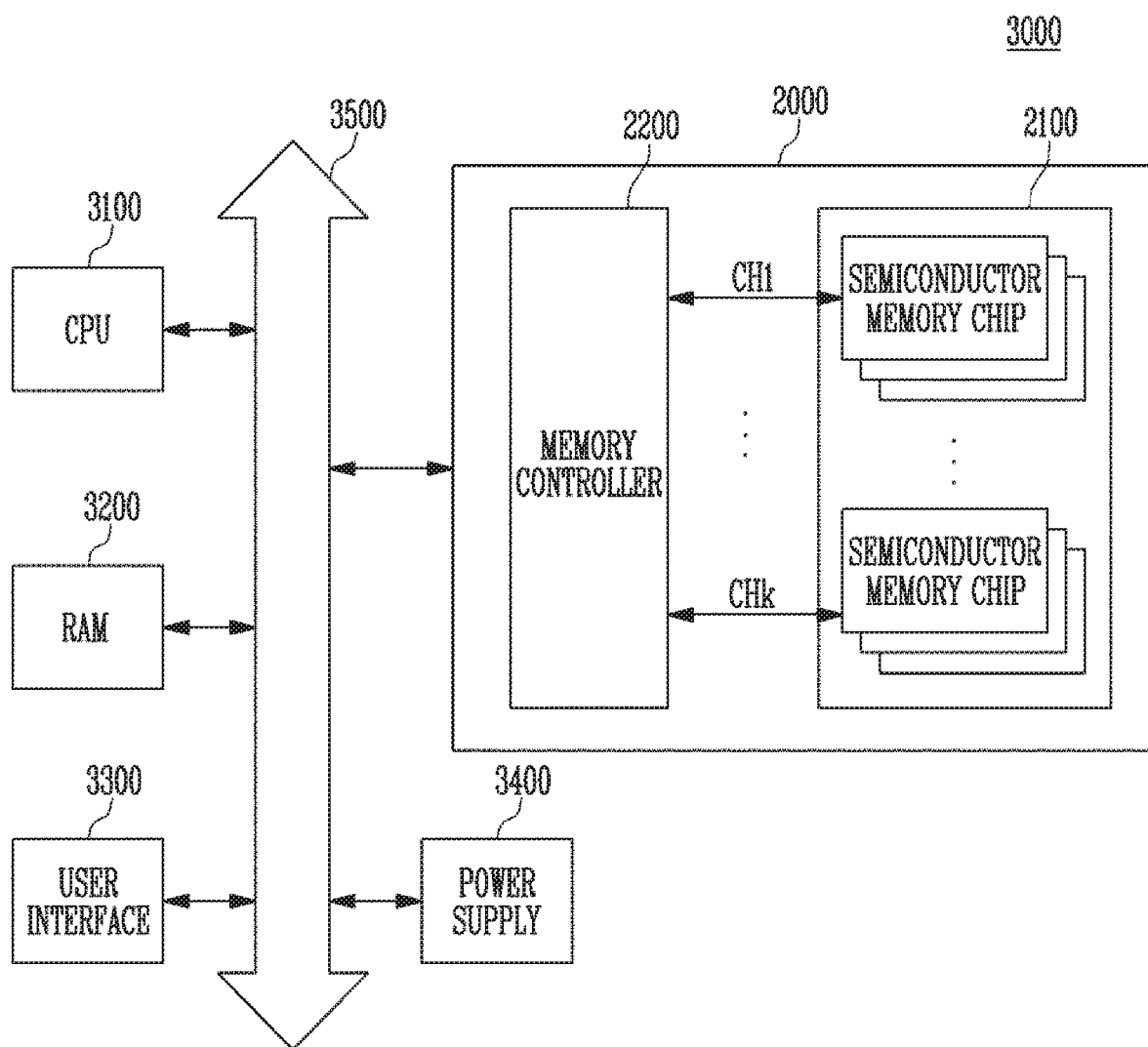
FIG. 17 is a block diagram illustrating a computing system including the memory system of FIG. 16 according to an embodiment of the present disclosure.

FIG. 17 is a block diagram illustrating a computing system 3000 including the memory system of FIG. 16.

Referring to FIG. 17, the computing system 3000 may include a central processing unit (CPU) 3100, a random access memory (RAM) 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Although a semiconductor memory device 2100 is illustrated as being coupled to the system bus 3500 through a memory controller 2200, the semiconductor memory device 2100 may be directly coupled to the system bus 3500. The function of the memory controller 2200 may be performed by the CPU 3100 and the RAM 3200.

In FIG. 17, although the memory system 2000 described with reference to FIG. 16 is illustrated, the memory system 2000 may be is replaced with the memory system 1000 described with reference to FIG. 15. In an embodiment, the computing system 3000 may be configured to include both the memory systems 1000 and 2000 described with reference to FIGS. 15 and 16.

In accordance with embodiments of the present disclosure, a memory controller having improved operation speed and a method of operating the memory controller are provided.

The embodiments disclosed in the present specification and the drawings aim to enable those skilled in this art to more clearly understand the present disclosure rather than to limit the bounds of the present disclosure. One skilled in the relevant art will easily understand, in light of the present disclosure, that various modifications are possible. Accordingly, the present invention encompasses all such modifications that fall within the scope of the claims.

What is claimed is:

1. A method of operating a memory controller to control a read operation of a semiconductor memory device, the method comprising:
sensing threshold voltages of memory cells included in a selected page of the semiconductor memory device using a plurality of sensing voltages within a determined range;
selecting memory cells to be used to determine an optimal read voltage from among the memory cells in the selected page;
detecting a number of the selected memory cells having threshold voltages corresponding to each of a plurality of threshold voltage intervals based on results of sensing of the threshold voltages; and
determining a voltage corresponding to a threshold voltage interval, in which the number of selected memory cells is smallest, as an optimal read voltage.

2. The method according to claim 1, further comprising:
controlling the operation of the semiconductor memory device such that a read operation is performed on the selected page based on the determined optimal read voltage.

3. The method according to claim 1, wherein the selecting of memory cells to be used to determine an optimal read voltage from among the memory cells in the selected page comprises:
selecting first memory cells in a first subset; and
selecting second memory cells in a second subset.

4. The method according to claim 3, wherein the first memory cells in the first subset and the second memory cells in the second subset are selected to be mutually exclusive.

5. The method according to claim 3, wherein some of the memory cells in the first subset are included in the second subset.

6. The method according to claim 3, wherein the detecting of the number of the selected memory cells having threshold voltages corresponding to each of a plurality of threshold voltage intervals based on results of sensing of the threshold voltages comprises:
detecting a number of memory cells in the first subset corresponding to each of the plurality of threshold voltage intervals based on results of sensing of the threshold voltages; and
detecting a number of memory cells in the second subset corresponding to each of the plurality of threshold voltage intervals based on results of sensing of the threshold voltages.

7. The method according to claim 6, wherein the determining of the voltage corresponding to a threshold voltage interval, in which the number of selected memory cells is smallest, as the optimal read voltage comprises:
determining a voltage corresponding to a threshold voltage interval, in which the number of memory cells in the first subset is smallest, as a first intermediate read voltage;
determining a voltage corresponding to a threshold voltage interval, in which the number of memory cells in the second subset is smallest, as a second intermediate read voltage; and
determining the optimal read voltage based on the first and second intermediate read voltages.

8. The method according to claim 7, wherein the optimal read voltage is determined by calculating an arithmetic mean of the first intermediate read voltage and the second intermediate read voltage.

* * * * *